United States Patent [19]

Fisher, Jr.

[11] 4,412,642

[45] Nov. 1, 1983

[54] CAST SOLDER LEADS FOR LEADLESS SEMICONDUCTOR CIRCUITS

[75] Inventor: John R. Fisher, Jr., Plainsboro, N.J.

[73] Assignee: Western Electric Co., Inc., New York, N.Y.

[21] Appl. No.: 358,412

[22] Filed: Mar. 15, 1982

[51] Int. Cl.³ .............................................. B23K 31/02
[52] U.S. Cl. ........................... 228/173 R; 228/180 A; 29/843; 29/874; 29/884
[58] Field of Search ................... 228/123, 124, 173 R, 228/180 A, 249, 253; 29/843, 874, 884, 880, 591; 164/80

[56] References Cited

U.S. PATENT DOCUMENTS

| | | | |
|---|---|---|---|
| 3,171,175 | 3/1965 | Curcio | 164/80 |
| 3,429,040 | 2/1969 | Miller | 29/626 |
| 3,589,000 | 6/1971 | Galli | 29/590 |
| 3,604,836 | 9/1971 | Pierpont | 174/52 PE |
| 3,719,981 | 3/1973 | Steitz | 29/423 |
| 3,835,531 | 9/1974 | Luttmer | 29/625 |
| 3,854,521 | 12/1974 | Hannes | 164/347 |
| 3,864,827 | 2/1975 | Schreiner et al. | 29/874 |
| 4,179,802 | 12/1979 | Joshi et al. | 29/628 |

OTHER PUBLICATIONS

"Leadless Carriers", by P. R. Jones, in *Electronics*, Aug. 25, 1981, pp. 137–140.
A Guide to Preform Soldering, Alloys Unlimited, Inc. 1959.

*Primary Examiner*—Nicholas P. Godici
*Assistant Examiner*—M. Jordan
*Attorney, Agent, or Firm*—M. M. de Picciotto

[57] ABSTRACT

The attachment of leadless chip carriers to printed wiring boards by means of soldering techniques must provide for a spacing between the chip carrier and the board. Such spacing is required for cleaning the area under the chip carrier, protecting the underlying circuitry, and accounting for stresses which may develop due to thermal mismatch between the chip carrier and the board, and to board flexure. Herein disclosed is a lead (15) for semiconductor chip carriers comprising an elongated body of high melting point electrically conductive material, e.g., solder material. Also disclosed is a method for casting such a solder lead, and a method for attaching a plurality of cast solder leads (38) to a leadless chip carrier (20).

11 Claims, 12 Drawing Figures

HEAT

CAST SOLDER LEADS FOR LEADLESS SEMICONDUCTOR CIRCUITS

TECHNICAL FIELD

The present invention relates to the fabrication of electronic circuit packages and in particular to a method for forming solder leads and a method for attaching such leads to leadless electronic components and circuits.

BACKGROUND OF THE INVENTION

Over the past few years, packaging of semiconductor integrated circuits utilizing chip carriers bonded to film circuits and/or to printed wiring boards (PWB) has become a major area of research and development (see, for example, the article by P. R. Jones entitled "Leadless Carriers, Components Increase Board Density by 6:1" in *Electronics,* Aug. 25, 1981, pages 137 to 140). When attaching leadless components and leadless chip carriers (LCC) to film circuits or printed wiring boards by means of soldering techniques, care should be taken to provide a spacing between the component/LCC and the film circuit or the PWB. Such spacing is required to enable the cleaning of the area underneath the component/LCC and to protect the circuitry under the LCC and on the PWB. Moreover, the LCC and the PWB often exhibit different thermal characteristics leading to in-plane stresses therebetween as the result of thermal mismatch. Also, any flexures of the film circuit or the PWB result in out-of-plane stresses on the leads connecting the LCC to the film circuit or the board. Prior art techniques have used small solder spheres or solder paste to attach LCC's to substrates. Although such known techniques have been used for surface mounting of electronic circuits on substrates, there exists a need for a compliant solder joint to compensate for large stresses resulting from thermal mismatches between the chip carrier and the board, as well as from board warpage and flexure.

SUMMARY OF THE INVENTION

The foregoing problems are solved by an embodiment of the present invention wherein a method for forming an electrically conductive lead comprises the steps of positioning an electrically conductive preform in alignment with a mold cavity of a molding plate, heating the molding plate to a predetermined reflow temperature, applying a force on the preform during the heating step thereby forcing molten preform material into the mold cavity, cooling the molding plate, and removing the applied force.

In accordance with another embodiment of the invention, a method for forming an array of electrically conductive solder leads comprises the steps of positioning an electrically conductive solder preform in alignment with each cavity of a plurality of mold cavities of a molding plate, heating the molding plate to a predetermined reflow temperature, applying a force on the solder preforms during the heating step thereby forcing molten solder into the cavities of the molding plate, cooling the molding plate, and removing the applied force on the cast solder leads.

In a further embodiment of the invention, a method for attaching an electrically conductive solder lead to a leadless component comprises the steps of applying flux to an electrical termination of the component, contacting the electrical termination with a molded cast solder lead, heating the component and the molded cast lead to a predetermined reflow temperature, cooling the component and the molded cast lead until the solder material solidifies, and removing the solder lead from the mold.

A still further embodiment of the present invention is directed to a method for attaching a plurality of electrically conductive leads to a leadless chip carrier (LCC) comprising the steps of applying flux to electrical terminations of the LCC, contacting the electrical terminations with corresponding solder cast leads of a molded cast lead array, heating the LCC and the molded cast lead array to a predetermined reflow temperature, cooling the LCC and the molded cast lead array until the solder material solidifies, and removing the solder leads from the mold.

One advantage of the present invention is the ability to provide reliable and consistent spacings between leadless electronic circuits or components (e.g., chip carriers) and substrates.

Another advantage of the present invention is to selectively control the distance between adjacent leads of a chip carrier while maintaining sufficient clearance between the chip carrier and the substrate.

A further advantage of the present invention is its capability of providing arrays of compliant electrically conductive leads for leadless electronic circuits and components.

A still further advantage of the present invention is the ability to control the geometry of solder joints thereby substantially improving the reliability of the joints.

These and other advantages of the present invention will appear more fully upon consideration of the various illustrative embodiments now to be described in detail in connection with the accompanying drawings.

The scale of all of the drawings to be described hereafter has been substantially enlarged in order to assist in the understanding of the various aspects of the present invention.

DETAILED DESCRIPTION

Figure 1A:
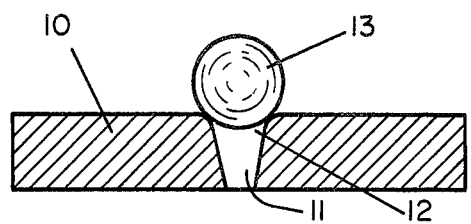
FIGS. 1A, 1B and 1C schematically illustrate a method for forming a lead in accordance with one embodiment of the present invention.
Figure 1B:
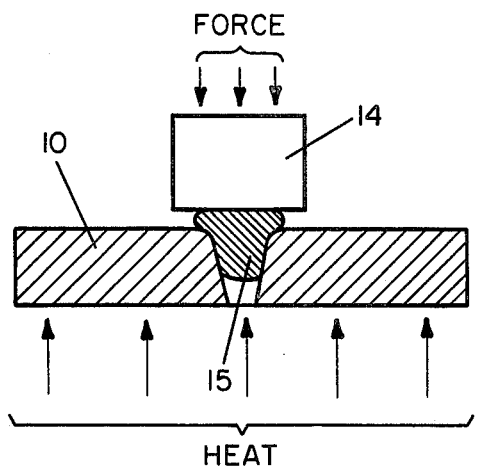
Figure 1C:
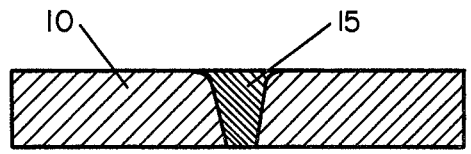

Shown in FIGS. 1A to 1C are various steps of a method for forming an electrically conductive lead in accordance with one embodiment of the invention. In FIG. 1A, a molding plate 10 has a mold cavity 11 therein with an upper opening region 12 adapted to receive a preform 13. The latter may comprise any electrically conductive material capable of being formed, shaped, or cast in a mold. Although the following description relates to a preform 13 made of a solder-type material, using other materials to form an elongated electrically conductive lead is well within the spirit and scope of the present invention. Preferably, mold cavity 11 has a generally tapered shape, and solder preform 13 has a spherical form in order to facilitate its positioning in alignment with the upper opening region 12 of cavity 11. The next steps of the proposed method comprise the heating of the molding plate 10 to a temperature at least equal to the reflow temperature of solder preform 13, and the application of a force on the preform to force molten solder into the cavity 11. Illustratively shown in FIG. 1B is a flat bottomed mass 14 contacting the preform and forcing the molten solder 15 into the cavity 11. However, other means of forcing molten solder in the cavity may be used without departing from the spirit and scope of the invention. For example, by applying vacuum to the bottom side of molding plate 10, molten solder 15 can be forced to fill the mold cavity 11.

Next, the method comprises the steps of cooling the molding plate 10 with the just-cast solder lead 15 therein, and removing the force applied by mass 14. Shown in FIG. 1C is the solder lead 15 cast in the molding plate and ready to be transferred to leadless electronic circuits or components. In the illustrative embodiment of FIGS. 1A to 1C, molding plate 10 may be made of aluminum, titanium or any other material capable of withstanding the casting process. A titanium plate is preferred due to its high durability and due to its thermal expansion characteristics matching those of ceramic electronic circuits. Several solder alloys were found to satisfactorily accomplish the foregoing lead casting technique. Cast leads were formed comprising 100% Sn; 96% Sn and 4% Ag; 88% Pb, 10% Sn and 2% Ag; and 75% Pb and 25% In. High tin content alloys, such as 100% Sn and 96% Sn and 4% Ag, are preferred because of consistency of fabrication, improved surface appearance and cast lead uniformity, enhanced joint strength in shear, and high temperature melting point. Heating of the molding plate 10 and the solder preform 13 to a temperature of about 300° C. which is above the melting temperature of the solder material yields a fast and reliable casting operation. The thickness of molding plate 10 is selected depending upon the desired length of the cast solder lead. Solder leads of between 15 and 50 mils in length were successfully formed using the foregoing technique.

Figure 2A:
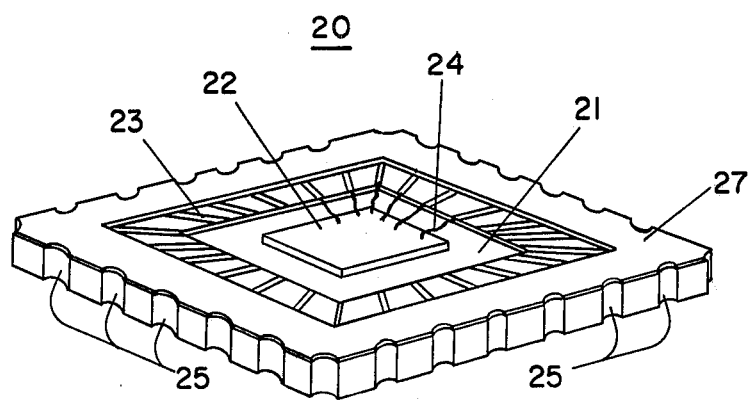
FIGS. 2A and 2B are perspective views of a known leadless chip carrier.
Figure 2B:
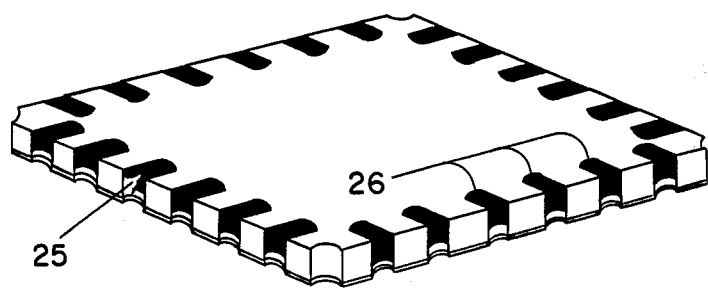

FIGS. 2A and 2B respectively show the top and bottom perspective views of a leadless chip carrier 20 (hereinafter sometimes referred to as the "LCC 20"). The carrier comprises a body having a recessed portion in the middle thereof. On the bottom part of the recessed portion, a metal layer 21 is deposited to act as contact pad for the underside of an integrated circuit chip 22. Contact pads 23 are deposited on a raised step along the peripheral area of the recessed portion. A plurality of connecting wires 24 couple predetermined contact regions of chip 22 with their corresponding contact pads 23. Each metal portion constituting the contact pad extends down a groove 25 along the edges of the carrier or through internal vias (not shown) to its underside to form a contact area 26 on the bottom surface of such carrier as shown in FIG. 2B. A metal layer 27 covers the upper surface of the carrier and serves as a bonding area for a carrier cap (not shown). Typically, leadless chip carrier 20 has overall dimensions ranging from 300 mils by 300 mils to one inch square with thicknesses of about 75 mils. Although shown as having 24 input/output contact areas, such an LCC may comprise any number of contact areas.

An embodiment of the present invention is directed to an improved technique for surface mounting a leadless electronic circuit for component (for example, of a type shown in FIGS. 2A and 2B) on a supporting substrate or printed wiring board. For illustration purposes only, the following description will refer to a leadless chip carrier as the leadless electronic circuit to be surface mounted on a PWB. However, the herein disclosed surface mounting techniques may be applied to other types of circuits and components (e.g., small leadless substrates, individual leadless passive components, etc.) without departing from the spirit and scope of the present invention.

Figure 3:
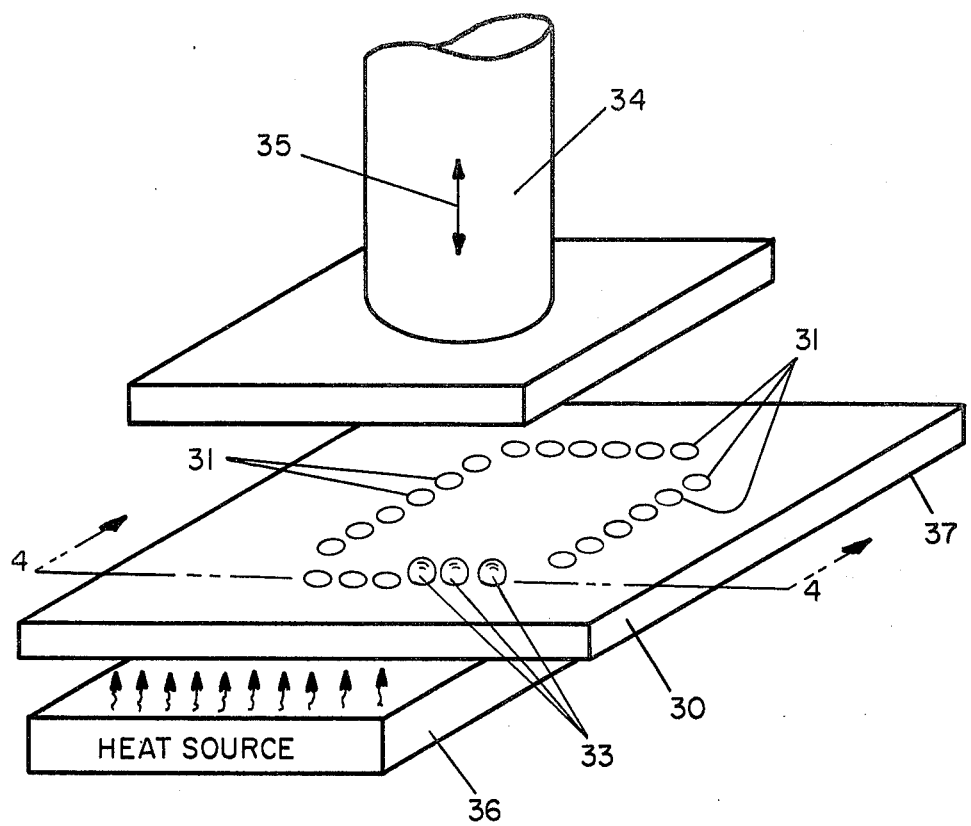
FIG. 3 is an exploded perspective view of an arrangement for casting an array of leads for a leadless electronic circuit in accordance with the present invention.

FIG. 3 of the drawings shows an exploded perspective view of an arrangement for casting an array of electrically conducting solder leads to be used as connection leads for the LCC 20 of FIGS. 2A and 2B. Molding plate 30 comprises a plurality of mold cavities 31 spaced at a predetermined distance from each other. Such a predetermined distance between adjacent cavities 31 corresponds to the distance between the metallization contact areas 26 of LCC 20 in FIG. 2B. Each mold cavity 31, which preferably has a tapered shape as explained in connection with cavity 11 in FIGS. 1A-1C, is adapted to receive solder preforms 33. A flat bottomed non-wetting mass 34, capable of moving in directions substantially perpendicular to the top surface of molding plate 30 (as shown by the arrow 35), is dimensioned to contact the solder preforms 33 and to force the molten solder material into the mold cavities 31. Melting of the solder preforms 33 is achieved, for example, by heating the molding plate 30 by means of a heating source 36 in contact with the bottom surface 37 of the plate. In order to achieve a fast and reliable cast lead fabrication process, heat source 36 is adapted to heat the molding plate 30 and the solder preforms 33 to a reflow temperature higher than the melting point of the solder. Preferably, the flat bottomed non-wetting mass 34 is heated to a temperature below the reflow temperature to prevent thermal energy loss from the casting site.

Figure 4A:
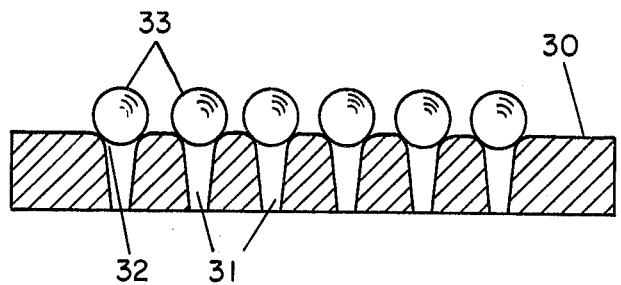
FIGS. 4A, 4B and 4C are cross-sectional views taken along the line 4—4 of FIG. 3 which schematically illustrate a method for casting an array of solder leads in accordance with a specific embodiment of the present invention.
Figure 4B:
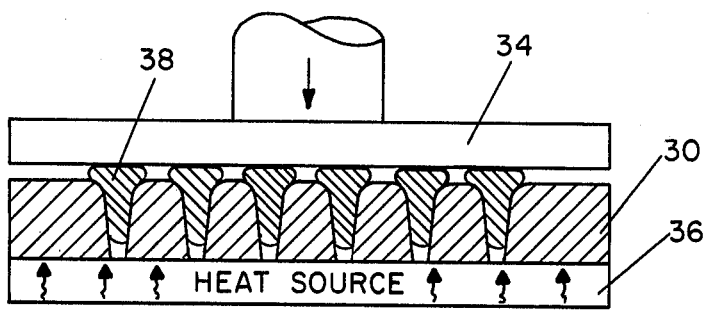
Figure 4C:
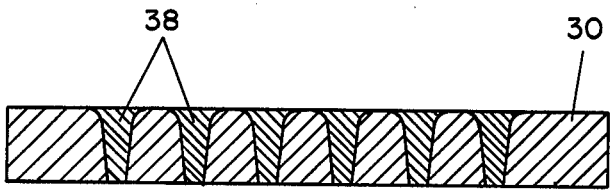

FIGS. 4A to 4C illustratively show the various steps of the method for casting the array of electrically conductive solder leads according to an embodiment of the invention. Shown in FIG. 4A is the molding plate 30 having six mold cavities 31 spaced at a predetermined distance from each other. Each mold cavity 31, which has preferably a tapered shape, has its upper opening region 32 adapted to receive the solder preform 33. The latter has preferably a spherical form in order to facilitate its positioning in the upper opening regions 32 of the cavities 31.

The next step of the proposed casting method comprises the heating of the plate 30 and of the spherical solder preforms 33, by means of heat source 36, and the application of a force by means of the flat bottomed mass 34, to all the solder preforms. The foregoing steps result in forcing molten solder 38 into the mold cavities 31 as illustratively shown in FIG. 4B. Next, the method comprises the steps of cooling the molding plate 30 with the just-cast solder leads 38 therein, and removing the force applied by mass 34. Shown in FIG. 4C is an array of solder leads 38 cast in the molding plate 30 and ready to be used as connection leads for leadless chip carriers, circuits, components, or other purposes.

Although the foregoing method was described in connection with a molding plate 30 having twenty-four mold cavities 31 arranged in a 6×6 square, the present method is applicable to a smaller, as well as larger, number of required connection leads. Mold cavities 31, may be machined in an aluminum plate, a titanium plate or any other plate capable of withstanding a casting process. For example, if applicable to the surface mounting of an LCC having 68 input/output leads, mold cavities 31 would be arranged in a square configuration (matching the metallization contact areas of the chip carrier) having 17 cavities on each side thereof. When used to surface mount an LCC having 84 input/output leads, mold cavities 21 would be arranged in a square having 21 cavities on each side thereof.

Figure 5A:
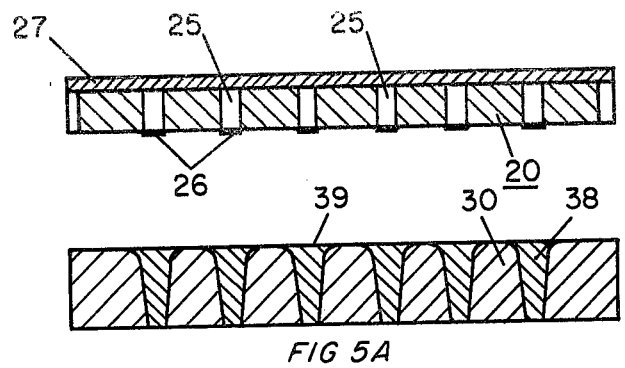
FIGS. 5A, 5B and 5C schematically illustrate a method for attaching a plurality of cast leads to a leadless chip carrier in accordance with a further embodiment of the present invention.
Figure 5B:
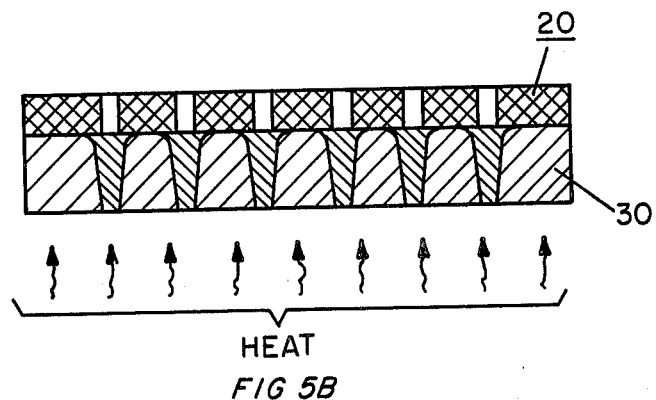
Figure 5C:
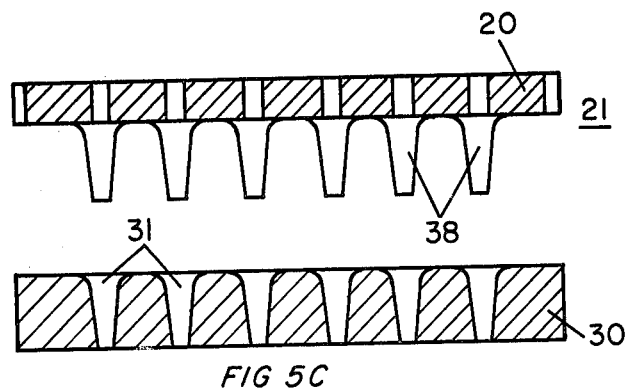

A method for attaching a plurality of electrically conductive cast solder leads to a leadless chip carrier (LCC) in accordance with another embodiment of the invention is schematically illustrated in FIGS. 5A, 5B and 5C. Referring to FIG. 5A, an array of solder leads 38 within a molding plate 30 (e.g., of a type shown in FIG. 4C) is to be attached to an LCC 20 (e.g., of a type shown in FIGS. 2A and 2B). Solder leads 38 should attach to the respective metallization contact areas 26 of the LCC 20. Therefore, LCC 20 and molding plate 30 are positioned such that each solder lead is aligned with its corresponding metallization contact area. Prior to such alignment, a commercially available soldering flux is applied to the metallization contact areas 26 in order to insure good wetting thereof. Next, as shown in FIG. 5B, the contact areas 26 are contacted with the upper portion 39 of their corresponding leads 38, and the LCC and the molding plate are heated to a predetermined reflow temperature to achieve a "transfer" of the leads from the plate to the chip carrier. Such reflow temperature, as explained above in connection with the casting of the solder leads, is preferably higher than the melting point of the solder used. For example, when using cast solder leads 38 made of 96% Sn and 4% Ag, the reflow temperature would preferably be of the order of 300° C., i.e., well above the melting temperature of 221° C. of such alloy.

The LCC 20 and the molding plate 30 are next cooled to enable the molten solder lead material to solidify. The LCC with the solder leads attached thereto is then separated from the molding plate, as shown in FIG. 5C, resulting in a cast-leaded chip carrier 21. The separation of the LCC from the molding plate is preferably achieved by first freezing the contacted structure including the LCC and the molding plate, and then removing the leads from the plate while the latter is still hot. The foregoing technique allows an easy release of the leads from the molding plate and prevents any excess stress on the solder leads due to dimensional changes associated with cooling.

Surface mounting of the cast-leaded chip carrier 21 to a printed wiring board (not shown) would comprise depositing solder (e.g., 60% Sn and 40% Pb) on predetermined contact zones of the PWB, aligning and contacting the cast-leads of the carrier with such zones, and reflowing the 60/40 solder. Reflow temperature, reflow time, relative volumes of solder, and cast-lead alloy are parameters which control the dissolution of the 60/40 solder into the higher melting point solder lead. Controlled dissolution results in a diffuse interface providing a smooth metallurgical transition from one type solder to the other. At the same time, an adequate clearance between the chip carrier and the PWB is maintained.

The foregoing illustrative embodiment has been presented merely to illustrate the pertinent inventive concepts. Numerous modifications can be made by those skilled in the art without departing from the spirit and scope of the invention.

What is claimed is:

1. A method for forming an electrically conductive lead comprising the steps of:
   positioning an electrically conductive preform in alignment with a mold cavity of a molding plate;
   heating the molding plate to a predetermined reflow temperature;
   applying a force on the preform during the heating step thereby forcing molten preform material into said mold cavity;
   cooling the molding plate; and
   removing the applied force.

2. A method for forming an electrically conductive solder lead comprising the steps of:
   positioning an electrically conductive solder preform in alignment with a mold cavity of a molding plate;
   heating the molding plate to a predetermined reflow temperature;
   applying a force on the solder preform during the heating step thereby forcing molten solder into said mold cavity;
   cooling the molding plate; and
   removing the applied force on the cast solder lead.

3. A method for forming an array of electrically conductive solder leads comprising the steps of:
   positioning an electrically conductive solder preform in alignment with each cavity of a plurality of mold cavities of a molding plate;
   heating the molding plate to a predetermined reflow temperature;
   applying a force on the solder preforms during the heating step thereby forcing molten solder into the cavities of the molding plate;
   cooling the molding plate; and
   removing the applied force on the cast solder leads.

4. A method for attaching an electrically conductive lead to a leadless component comprising the steps of:
   applying flux to an electrical termination of the component;
   contacting said electrical termination with a molded cast lead within a mold;
   heating the component and the molded cast lead to a predetermined reflow temperature;
   cooling the component and the molded cast lead until the material of said lead solidifies; and
   removing the lead from the mold.

5. A method for attaching an electrically conductive solder lead to a leadless component comprising the steps of:
   applying flux to an electrical termination of the component;
   contacting said electrical termination with a molded cast solder lead within a mold;
   heating the component and the molded cast lead to a predetermined reflow temperature;
   cooling the component and the molded cast lead until the solder material solidifies; and
   removing the solder lead from the mold.

6. A method for attaching a plurality of electrically conductive leads to a leadless chip carrier (LCC) comprising the steps of:
   applying flux to electrical terminations of the LCC;
   contacting said electrical terminations with corresponding solder cast leads of a molded cast lead array within a mold;
   heating the LCC and the molded cast lead array to a predetermined reflow temperature;
   cooling the LCC and the molded cast lead array until the solder material solidifies; and
   removing the solder leads from the mold.

7. A method for attaching a plurality of electrically conductive leads to a leadless chip carrier (LCC) having a plurality of electrical terminations comprising the steps of:
   positioning an electrically conductive solder preform in alignment with each cavity of a plurality of mold cavities of a molding plate, said cavities being arranged in a pattern corresponding to said electrical terminations;
   heating the molding plate to a predetermined reflow temperature while applying a force on the solder preforms thereby forcing molten solder into the cavities of the molding plate;
   cooling the molding plate;
   removing the applied force on the cast solder leads;
   applying flux to the electrical terminations of the LCC;
   contacting said electrical terminations with corresponding casted solder leads of the molding plate;
   heating the LCC and the molding plate to said predetermined reflow temperature;
   cooling the LCC and the molding plate until the solder material solidifies; and
   separating the LCC with the solder leads attached thereto from the molding plate.

8. A method according to claim 1, 2, 3 or 7 wherein the electrically conductive preform comprises a high melting point material.

9. A method according to claim 8 wherein said high melting point material is selected from the group consisting of 100% Sn; 96% Sn and 4% Ag; 88% Pb, 10% Sn and 2% Ag; and 75% Pb and 25% In.

10. A method according to claim 4, 5 or 6 wherein the molded cast lead comprises a high melting point material.

11. A method according to claim 10 wherein said high melting point material is selected from the group consisting of 100% Sn; 96% Sn and 4% Ag; 88% Pb, 10% Sn and 2% Ag; and 75% Pb and 25% In.

* * * * *